US012568589B2

(12) United States Patent
Ko et al.

(10) Patent No.: US 12,568,589 B2
(45) Date of Patent: Mar. 3, 2026

(54) METHOD OF BONDING COLUMN TYPE DEPOSITS

(71) Applicant: PROTEC CO., LTD., Gyeonggi-do (KR)

(72) Inventors: Youn Sung Ko, Gyeonggi-do (KR); Geunsik Ahn, Seoul (KR)

(73) Assignee: PROTEC CO., LTD., Gyeonggi-do (KR)

( * ) Notice: Subject to any disclaimer, the term of this patent is extended or adjusted under 35 U.S.C. 154(b) by 0 days.

(21) Appl. No.: 18/605,775

(22) Filed: Mar. 14, 2024

(65) Prior Publication Data

US 2024/0314939 A1     Sep. 19, 2024

(30) Foreign Application Priority Data

Mar. 15, 2023    (KR) ........................ 10-2023-0033603

(51) Int. Cl.
| | |
|---|---|
| *H05K 3/3489* | (2026.01) |
| *B23K 26/12* | (2014.01) |
| *B23K 26/21* | (2014.01) |
| *B23K 101/42* | (2006.01) |
| *H05K 3/3452* | (2026.01) |
| *H05K 3/3494* | (2026.01) |

(52) U.S. Cl.
CPC ....... *H05K 3/3489* (2013.01); *B23K 26/1224* (2015.10); *B23K 26/21* (2015.10); *H05K 3/3452* (2013.01); *H05K 3/3494* (2013.01); *B23K 2101/42* (2018.08)

(58) Field of Classification Search
None
See application file for complete search history.

(56) References Cited

U.S. PATENT DOCUMENTS

| | | | |
|---|---|---|---|
| 6,276,596 B1 * | 8/2001 | Gruber ................ | H01L 21/4846 228/225 |
| 8,115,310 B2 * | 2/2012 | Masumoto .............. | H01L 24/16 257/737 |
| 9,048,135 B2 * | 6/2015 | Hwang ................... | H01L 24/11 |
| 2004/0144834 A1 * | 7/2004 | Nomoto .............. | H05K 3/3478 228/180.1 |
| 2004/0238602 A1 | 12/2004 | Furuno et al. | |
| 2011/0103029 A1 | 5/2011 | Kitajima | |

FOREIGN PATENT DOCUMENTS

| | | | | |
|---|---|---|---|---|
| CN | 101567349 | 10/2009 | | |
| CN | 112331619 | 2/2021 | | |
| JP | H07183652 | 7/1995 | | |
| JP | 2002110723 | 4/2002 | | |
| JP | 2018018985 | 2/2018 | | |
| JP | 2023006170 | 1/2023 | | |
| KR | 101865234 B1 * | 6/2018 | ............. | H01L 23/48 |
| KR | 20190046274 | 5/2019 | | |
| KR | 20220005724 | 1/2022 | | |
| WO | WO-2022010235 A1 * | 1/2022 | ............. | H01L 24/81 |

* cited by examiner

*Primary Examiner* — Devang R Patel
(74) *Attorney, Agent, or Firm* — JCIPRNET

(57) ABSTRACT

Provided is a method of bonding column type deposits, and more specifically, a method of bonding, to a substrate, column type deposits which are formed in a column shape and connect a substrate and electrodes of a semiconductor chip so as to connect the semiconductor chip to the substrate. The method of bonding the column type deposits to the substrate enables bonding the column type deposits having a high aspect ratio to accurate positions while being kept aligned vertically on the substrate.

8 Claims, 2 Drawing Sheets

METHOD OF BONDING COLUMN TYPE DEPOSITS

CROSS-REFERENCE TO RELATED APPLICATION

This application is based on and claims priority under 35 USC § 119 to Korean Patent Application No. 10-2023-0033603, filed on Mar. 15, 2023, in the Korean Intellectual Property Office, the disclosure of which is incorporated by reference herein in its entirety.

TECHNICAL FIELD

The present disclosure relates to a method of bonding column type deposits, and more specifically, to a method of bonding, to a substrate, column type deposits which are formed in a column shape and connect a substrate and electrodes of a semiconductor chip so as to connect the semiconductor chip to the substrate.

DESCRIPTION OF THE RELATED ART

Column (or pillar) type deposits called Cu pillars, Cu pins, or the like are used when bonding a semiconductor chip onto a substrate or another semiconductor chip in the form of package on package (POP) or chip on chip (CoC) by stacking a plurality of semiconductor chips. When electrically connecting upper and lower semiconductor chips or substrates with a relatively great height difference, it is inappropriate to use solder balls. When using solder balls, it is difficult to align electrodes at fine pitches, so it is not suitable for miniaturization of semiconductor devices.

Therefore, column (or pillar) type deposits with a high aspect ratio, such as copper pillars, are used to electrically connect the electrodes of upper and lower semiconductor chips or substrates.

When the column type deposits have widths of 100 μm or less, there is a difficulty in applying a process of forming solder bumps using the related art solder balls. When the column type deposits are small and light, the positions and angles of the column type deposits change due to the characteristics of viscous liquid during the melting process of cream solder or solder paste. This causes a high probability of defects. In particular, when the column type deposit has a high aspect ratio, the column type deposits are easily tilted during a heating process due to the viscosity of the solder paste or flux.

To solve this problem, in the related art, a method of bonding column type deposits onto a substrate by pressing the column type deposits using a pressing plate to be fixed to the substrate and raising temperature has been attempted. However, such fine column type deposits often had a margin of length and the surface height of the substrate was not constant, which caused a problem that a plurality of column type deposits were not all pressed uniformly.

To solve this problem, there is a need for a technology that can vertically bond column type deposits with a high aspect ratio to accurate positions on a substrate.

SUMMARY

The present disclosure has been derived to meet the need described above, and is directed to provide a method of bonding column type deposits onto a substrate, in which column type deposits for connecting the substrate and a semiconductor device are bonded to the substrate in accurate positions and direction.

Additional aspects will be set forth in part in the description which follows and, in part, will be apparent from the description, or may be learned by practice of the presented embodiments of the disclosure.

The present disclosure relates to a method of bonding column type deposits, including: (a) preparing a substrate on which metal connection layers are formed on a plurality of electrode pads, respectively; (b) applying a flux to the metal connection layers of the plurality of electrode pads on the substrate; (c) mounting column type deposits on upper surfaces of the metal connection layers on the flux-applied substrate, respectively; (d) rotating the substrate upside down, on which the column type deposits have been mounted; (e) heating an assembly of the substrate and the column type deposits to melt the metal connection layers of the substrate; and (f) cooling the assembly of the substrate and the column type deposits so that the melted metal connection layers of the substrate are hardened, after completion of the step (e).

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
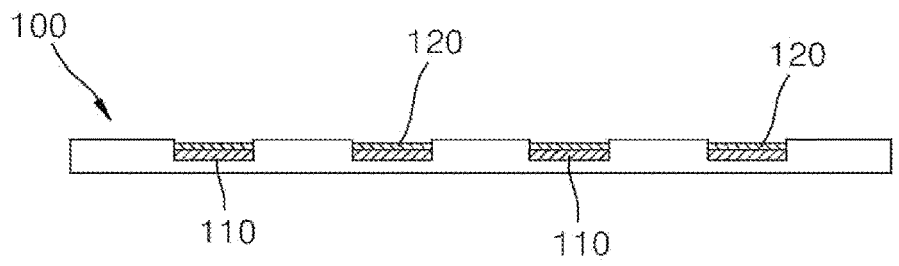
FIGS. 1 through 5 are diagrams for illustrating a process of executing a method of bonding column type deposits in accordance with one embodiment of the present disclosure.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein.

Hereinafter, a description will be given of a method of bonding column type deposits according to one embodiment of the present disclosure, with reference to the attached drawings.

FIGS. 1 through 5 are diagrams for illustrating a process of executing a method of bonding column type deposits in accordance with one embodiment of the present disclosure.

The present disclosure is directed to connecting column type deposits 200 with a high aspect ratio, such as copper pillars (Cu pillars) or copper pins (Cu pins), to a substrate 100. The column type deposit 200 may often have a width of 100 μm or less and a height that is 1.5 times or more of the width. In this way, the use of the column type deposits 200 that have a high aspect ratio and are small in size may enable a semiconductor chip to be bonded to the substrate 100 at fine pitch intervals.

In order to bond a semiconductor chip to the substrate 100 using column type deposits with a high aspect ratio, the present disclosure is directed to bonding the column type deposit 200 to the electrode of the substrate 100 at an accurate position and in an accurate direction.

First, as illustrated in FIG. 1, the substrate 100 that metal connection layers 120 are formed on a plurality of electrode pads 110 may be prepared (step (a)). It may be usually said that the pre-coated substrate 100 is prepared through this process. The pre-coating may refer to coating a copper-exposed portion of the substrate 100 in order to prevent oxidation of the copper wire circuit of the printed circuit board (PCB) 100 and facilitate connection with mounted components. In this embodiment, the metal connection film 120 may be formed by the pre-coating on the electrode pad 110 at a position to which the column type deposit 200 is to be bonded. This PCB surface treatment may prevent oxidation of the copper-exposed portion of a copper foil layer, which is left exposed (open) for disposing integrated circuits (ICs) and electronic components on the PCB surface, and increase bonding strength for mounting the electronic components on the surface. Typically, pre-coating for the substrate 100 may be performed using gold, silver, tin, palladium, or an alloy of these metals. In some cases, the metal connection film 120 may also be formed by applying solder paste and then performing pre-coating through reflow.

Figure 2:
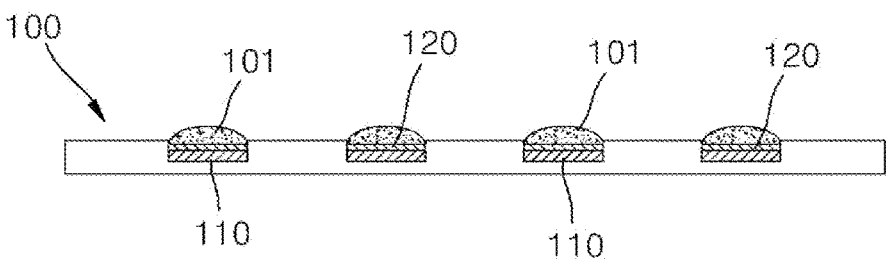

Next, as illustrated in FIG. 2, a flux 101 may be applied to each metal connection film 120 of the electrode pad 110 of the substrate 100 (step (b)). The flux 101 may be applied to the upper surface of the metal connection film 120 of the substrate 100 by using a mask printing method or a dispenser.

Figure 3:
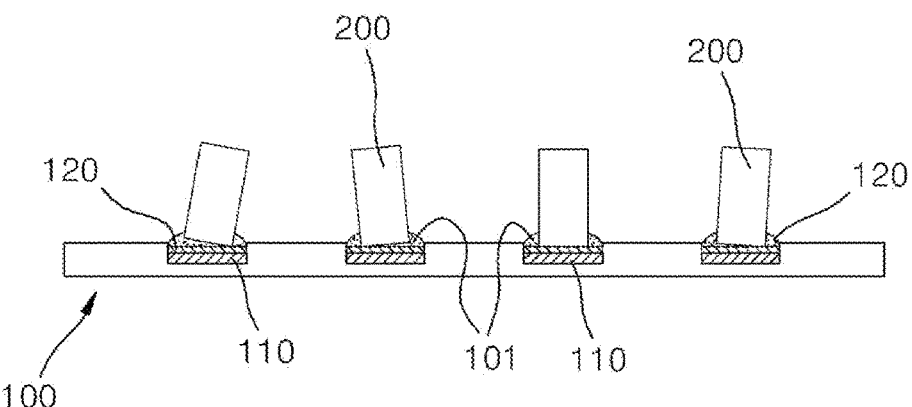

Next, as illustrated in FIG. 3, the column type deposit 200 may be mounted on the upper surface of each metal connection film 120 of the substrate 100 on which the flux 101 is applied (step (c)). In this way, the process of mounting the column type deposits 200 on the substrate 100 may be performed by various known methods. The column type deposits 200 may also be mounted on the substrate 100 by a pick and place method in which the column type deposits 200 are clamped individually or in plurality by using a tool such as a gripper to be placed on designated positions. In some cases, the column type deposits may also be mounted such that a mask with mounting holes, which are formed at positions corresponding to the plurality of electrode pads 110 of the substrate 100, is disposed on the upper surface of the substrate 100 and the column type deposits 200 are inserted into the mounting holes of the mask. At this time, the column type deposits 200 may be mounted on the substrate 100 at high speed by using a device such as a cyclone head. In this way, when the column type deposits 200 are mounted on the substrate 100, the column type deposits 200, as illustrated in FIG. 3, may not stand upright on the upper surface of the substrate 100. Since the column type deposits 200 are very small and light, it may often occur that the column type deposits 200 are mounted in a tilted state, as illustrated in FIG. 3, due to the viscosity or surface tension of the flux 101. The present disclosure may be characterized by vertically aligning even the tilted column type deposits 200 to be bonded to the substrate 100.

Figure 4:
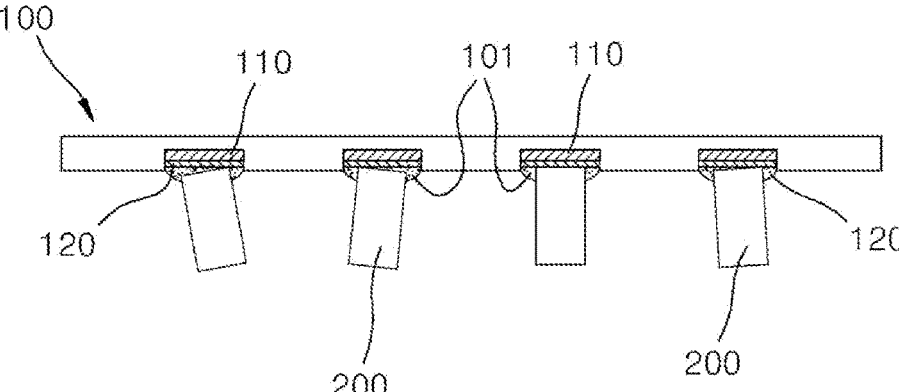

In this state, in the method of bonding the column type deposits on the substrate according to an embodiment of the present disclosure, the substrate 100 on which the column type deposits 200 are mounted may rotate to be upside down, as illustrated in FIG. 4 (step (d)). Since the column type deposits 200 are very light compared to the viscosity of the flux 101, the column type deposits 200 may be temporarily bonded to the substrate 100 by the adhesive force of the flux 101, and even in the upside-down state as illustrated in FIG. 4, the column type deposits 200 may not fall off the substrate 100.

In this state, the assembly of the substrate 100 and the column type deposits 200 may be heated so that the metal connection layers 120 of the substrate 100 are melted (step (c)). When the substrate 100 and the column type deposits 200 are heated in this way, the metal connection layers 120 may be melted with the help of the flux 101, so that the column type deposits 200 are bonded to the substrate 100. At this time, as the metal connection layers 120 are melted and the flux 101 is also heated, the viscosity of the flux 101 or the metal connection film 120 that temporarily bonds the column type deposits 200 to the substrate 100 may be lowered. As the viscosity of the material that bonds the column type deposits 200 decreases and the surface tension weakens, the column type deposits 200 may be aligned vertically with the direction of gravity. In particular, as the aspect ratio of the column type deposits 200 increases, the effect of gravity on the vertical alignment of the column type deposits 200 may increase.

In this way, the process of heating the substrate 100 and the column type deposits 200 to perform the step (c) may be performed by various known methods. The step (c) may also be performed in a manner of allowing the assembly of the substrate 100 and the column type deposits 200 to undergo reflow. Alternatively, it may be possible to heat the metal connection film 120 by irradiating a laser to the upper or lower surface of the substrate 100 in the upside-down state made in step (d).

In this way, temperature at which the substrate 100 is heated by performing the step (c) and a temperature change over time may be adjusted variously in an optimized manner according to the size and shape of the column type deposits 200 and the characteristics of the materials of the flux 101 and the metal connection film 120. By adjusting the process conditions in this way, the column type deposits 200 may be effectively aligned vertically by solving the degree of tilt of the column type deposits 200 while preventing the column type deposits 200 from falling off the substrate 100. In addition, during the steps (b) through (d), even if the position of the column type deposit 200 is partially misaligned with the position of the electrode pad 110, the column type deposit 200 may naturally move toward the central portion of the electrode pad 110 by the viscosity of the melted metal while the metal connection film 120 and the flux 101 are melted.

On the other hand, in the step (d), when heating is performed in a vacuum atmospheric state, void generation in the melted state of the metal connection film 120 and the flux 101 may be suppressed, obtaining an advantage of improving the quality of the process.

Next, when the assembly of the substrate 100 and the column type deposits 200 is cooled so that the melted metal connection layers 120 are hardened, the bonding of the column type deposits 200 to the substrate 100 may be completed (step (f)).

As such, the present disclosure may have an advantage in that the column type deposit 200, which is difficult to be handled due to its extremely small size and high aspect ratio and also difficult to be mounted by adjusting its position and direction accurately and precisely, is allowed to be bonded to the substrate 100 in an accurate and correct posture. In particular, through thinking differently, the substrate 100 may rotate upside down, such that the column type deposits 200 are bonded to the substrate 100 by heating the flux 101 while hanging upside down on the substrate 100. Accordingly, the present disclosure may have an advantage of enabling the column type deposits 200 to be bonded to the substrate 100 by aligning such fine column type deposits 200 accurately in position and direction using the characteristics of gravity, without using a separate complicated configuration or device.

Although the present disclosure has been described above with preferred examples, the scope of the present disclosure is not limited to the form described and shown above.

For example, in steps (c) and (f), heating and cooling may be executed using various methods other than using the reflow or laser.

In addition, a method of bonding column type deposits on a substrate according to the present disclosure may also be executed as described below.

A method of bonding column type deposits on a substrate according to this embodiment may mostly have the same processes as those in the embodiment previously described with reference to FIGS. 1 through 5, but may have a difference in view of using a pressing plate 300 to perform the step (d).

The method of bonding the column type deposits on the substrate according to this embodiment may equally include preparing the substrate 100 on which the metal connection layers 120 are formed (step (a)), applying the flux 101 (step (b)), and mounting the column type deposits 200 on the substrate 100 (step (c)), as illustrated in FIGS. 1 through 3.

Figure 6:
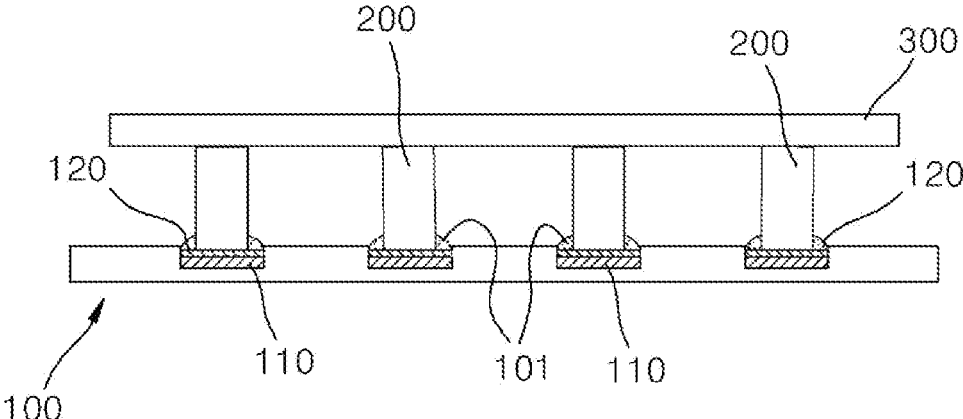
FIGS. 6 and 7 are diagrams for illustrating a process of executing a method of bonding column type deposits in accordance with another embodiment of the present disclosure.

Next, as illustrated in FIG. 6, the column type deposits 200 may be pressed onto the upper surface of the substrate 100 using a pressing plate 300 in a flat shape (step (d-1)). When the column type deposits 200 are pressed using the pressing plate 300 in this way, it may, in some cases, help the column type deposits 200 to be aligned in accurate position and direction on the substrate 100 while overcoming the viscosity of the flux 101.

Figure 7:
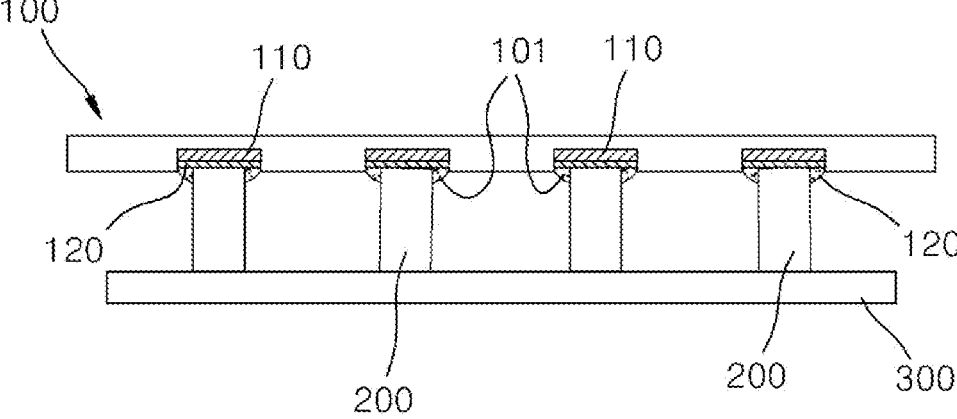

In this state, the pressing plate 300 may be removed, or as illustrated in FIG. 7, the pressing plate 300 and the substrate 100 may be simultaneously turned upside down while column type deposits 200 are pressed by the pressing plate 300 (step (d-2)).

In this state, the pressing plate 300 may be removed (step (d-3)).

Figure 5:
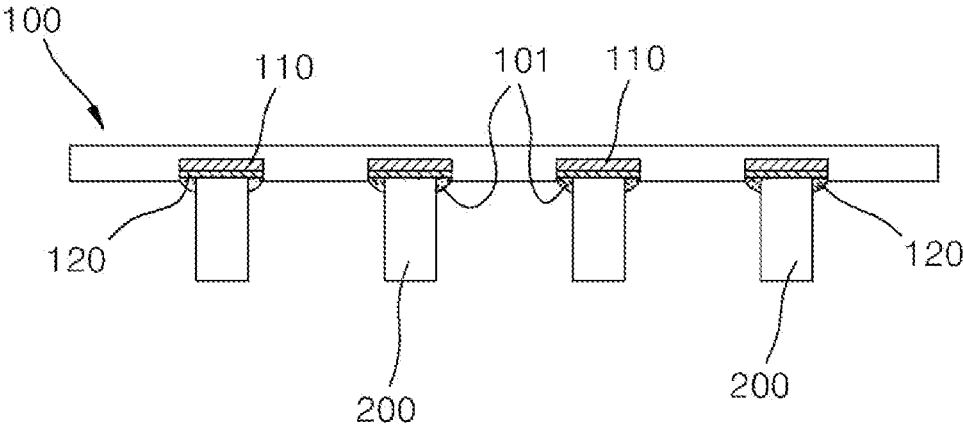

As illustrated in FIG. 5, upon heating the substrate 100 and the column type deposits 200 (step (c)) and cooling the assembly of the substrate 100 and the column type deposits 200 (step (f)), bonding of the column type deposits 200 to the substrate 100 may be completed.

In some cases, instead of performing the steps (e) and (f) after removing the pressing plate 300, the step (d-3) of removing the pressing plate 300 may alternatively be executed while performing the step (e) or (f).

This embodiment may also have the equal or similar effects to those in the embodiment described above with reference to FIGS. 1 through 5. Furthermore, the additional use of the pressing plate 300 as described above may provide an additional effect of aligning the column type deposits 200 on the substrate 100 or reducing the degree of tilt of the column type deposits 200 with respect to the substrate 100.

The shape of the pressing plate 300 may not be limited to the flat shape. Various shapes of pressing plates may be usable as long as they have a structure that is capable of uniformly pressing the plurality of column type deposits 200 on the substrate 100.

A method of bonding column type deposits according to the present disclosure has the advantage of bonding the column type deposits having a high aspect ratio to accurate positions while being kept aligned vertically on the substrate.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A method of bonding column type deposits, the method comprising:
    (a) preparing a substrate on which metal connection layers are formed on a plurality of electrode pads, respectively;
    (b) applying a flux to the metal connection layers of the plurality of electrode pads on the substrate;
    (c) mounting column type deposits on upper surfaces of the metal connection layers on the flux-applied substrate, respectively;
    (d) rotating the substrate on which the column type deposits have been mounted, so that the column type deposits are suspended upside down to the substrate by the flux, wherein the step (d) comprises:
    (d-1) pressing the column type deposits onto an upper surface of the substrate by using a pressing plate; and
    (d-2) simultaneously turning the pressing plate and the substrate upside down;
    (e) heating an assembly of the substrate and the column type deposits to melt the metal connection layers of the substrate; and
    (f) cooling the assembly of the substrate and the column type deposits so that the melted metal connection layers of the substrate are hardened, after completion of the step (e).

2. The method of claim 1, wherein the step (a) is to form the metal connection layers by coating the plurality of electrode pads of the substrate with a metal material.

3. The method of claim 1, wherein the step (c) is to mount the column type deposits on the substrate by disposing a mask on the upper surface of the substrate, the mask having mounting holes at positions corresponding to the plurality of electrode pads of the substrate.

4. The method of claim 1, wherein the step (c) is to mount the column type deposits on the plurality of electrode pads of the substrate, respectively, in a pick and place manner.

5. The method of claim 1, wherein the step (e) is to heat the substrate or the column type deposits by irradiating a laser.

6. The method of claim 1, wherein the step (e) is to heat the assembly of the substrate and the column type deposits by undergoing a reflow.

7. The method of claim 1, wherein the step (e) is performed in a vacuum state.

8. The method of claim 1, wherein the step (d) further comprises:
    (d-3) removing the pressing plate after completion of the step (d-2).

\* \* \* \* \*